United States Patent
Kido et al.

(10) Patent No.: US 10,892,329 B2
(45) Date of Patent: Jan. 12, 2021

(54) METHOD FOR MANUFACTURING SEMICONDUCTOR DEVICE, AND POWER CONVERSION DEVICE

(71) Applicant: Mitsubishi Electric Corporation, Tokyo (JP)

(72) Inventors: Shigenori Kido, Tokyo (JP); Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/444,953

(22) Filed: Jun. 18, 2019

(65) Prior Publication Data

US 2020/0027952 A1   Jan. 23, 2020

(30) Foreign Application Priority Data

Jul. 23, 2018  (JP) .................................. 2018-137714

(51) Int. Cl.
| | |
|---|---|
| H01L 29/08 | (2006.01) |
| H01L 21/8234 | (2006.01) |
| H01L 27/088 | (2006.01) |
| H01L 29/66 | (2006.01) |
| H01L 29/06 | (2006.01) |
| H01L 29/78 | (2006.01) |
| H01L 29/49 | (2006.01) |
| H01L 29/45 | (2006.01) |

(52) U.S. Cl.
CPC .. *H01L 29/0878* (2013.01); *H01L 21/823481* (2013.01); *H01L 27/088* (2013.01); *H01L 29/0692* (2013.01); *H01L 29/456* (2013.01); *H01L 29/4908* (2013.01); *H01L 29/66893* (2013.01); *H01L 29/7801* (2013.01)

(58) Field of Classification Search
CPC ............. H01L 29/0878; H01L 29/0692; H01L 29/456; H01L 29/4908; H01L 21/823481
See application file for complete search history.

(56) References Cited

U.S. PATENT DOCUMENTS

| | | | | |
|---|---|---|---|---|
| 2003/0045074 A1* | 3/2003 | Seibel | ................... | H01L 21/268 |
| | | | | 438/486 |
| 2004/0232522 A1 | 11/2004 | Shimizu | | |

(Continued)

FOREIGN PATENT DOCUMENTS

JP       2004-349296 A    12/2004

*Primary Examiner* — Marc Anthony Armand
(74) *Attorney, Agent, or Firm* — Studebaker & Brackett PC

(57) ABSTRACT

The semiconductor device includes: an epitaxial layer of a first conductivity type formed on a first principal surface of a semiconductor substrate; a first semiconductor region of the first conductivity type formed from an outermost surface to an inner portion of the epitaxial layer; and a third semiconductor region of a second conductivity type formed from a bottom surface of the first semiconductor region to an inner portion of the semiconductor substrate. The method includes: (a) polishing a second principal surface opposite to the first principal surface of the semiconductor substrate above which at least a source region, a drain region, and a gate electrode are formed to thin the substrate; and (b) ion-implanting impurities of the second conductivity type from the second principal surface of the polished semiconductor substrate to form the third semiconductor region.

8 Claims, 10 Drawing Sheets

(56) References Cited

U.S. PATENT DOCUMENTS

2005/0073007 A1* 4/2005 Chen .................. H01L 29/1083
257/355
2018/0286880 A1* 10/2018 Sakamoto ............... G05F 3/247
2018/0323115 A1* 11/2018 Preisler ................ H01L 21/266

* cited by examiner

F I G. 9
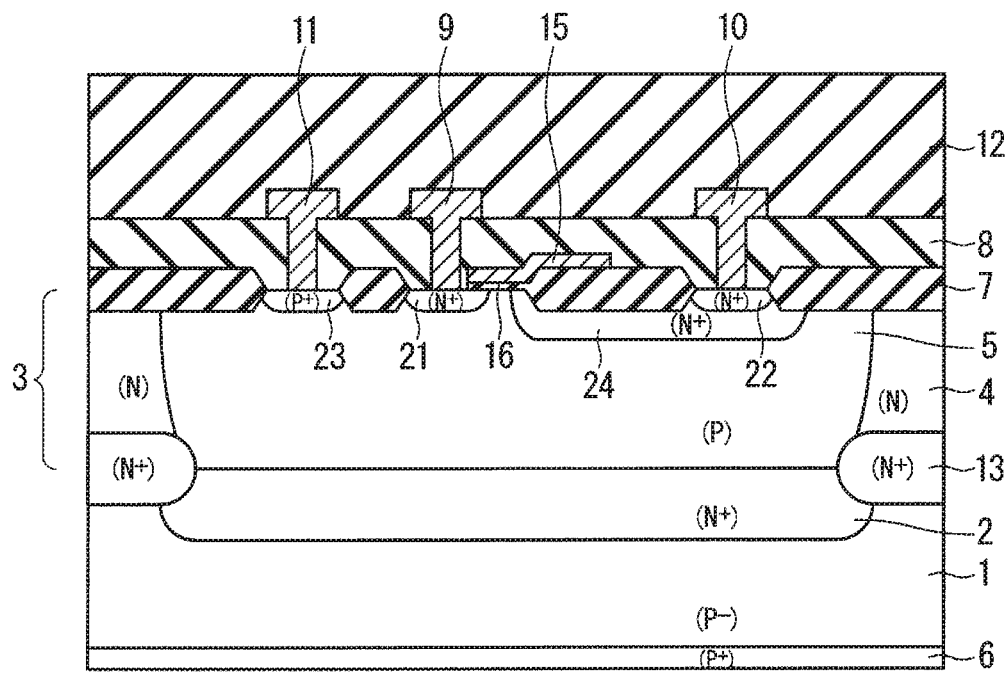
F I G. 10
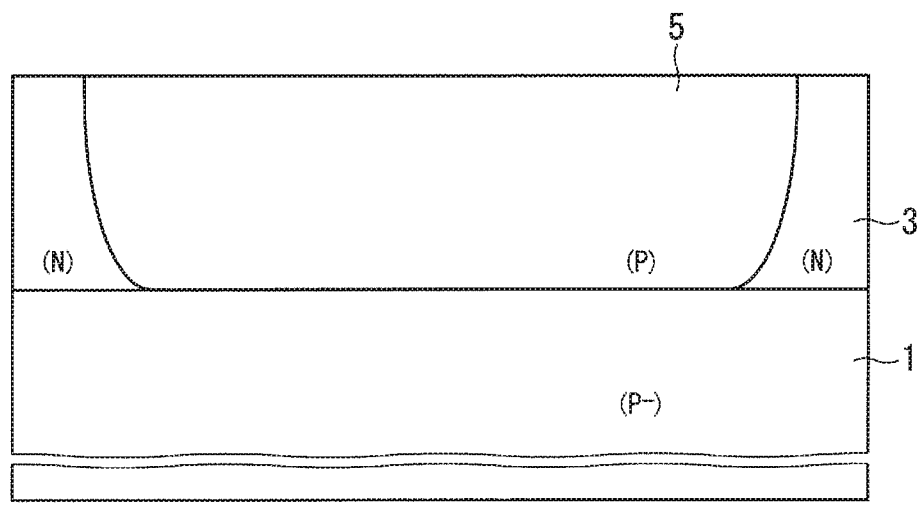

F I G. 1 3
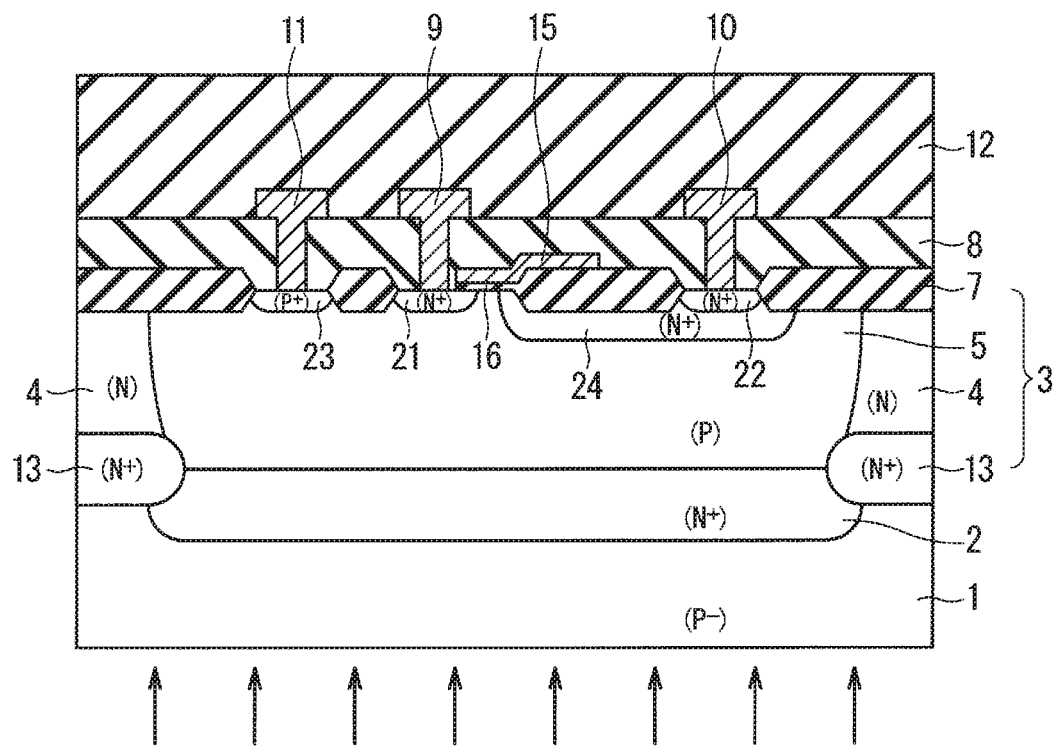
F I G. 1 4
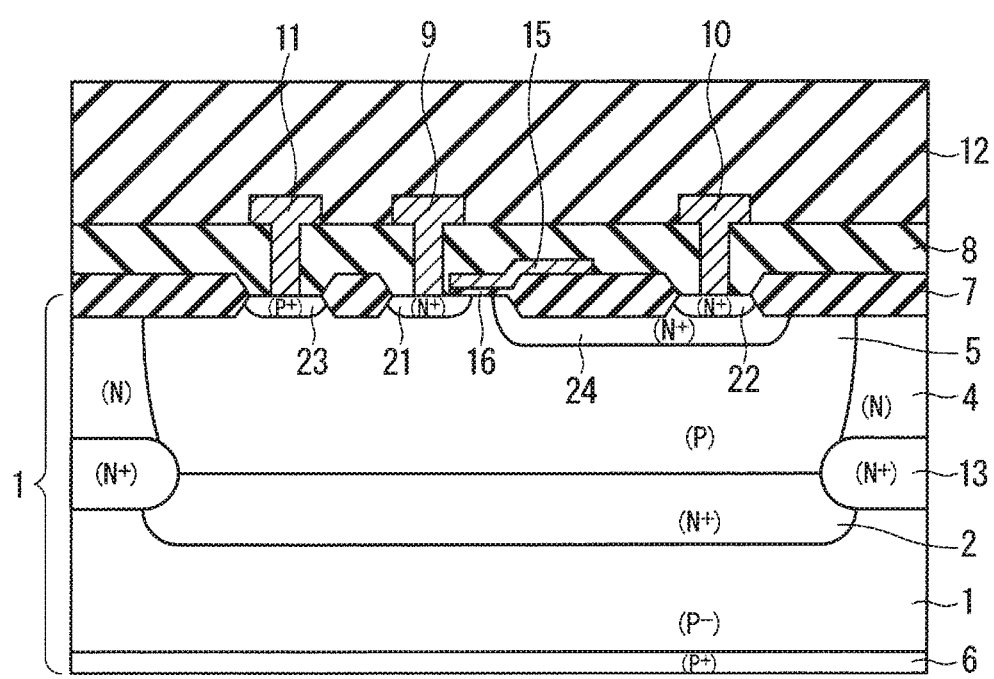

F I G. 1 5
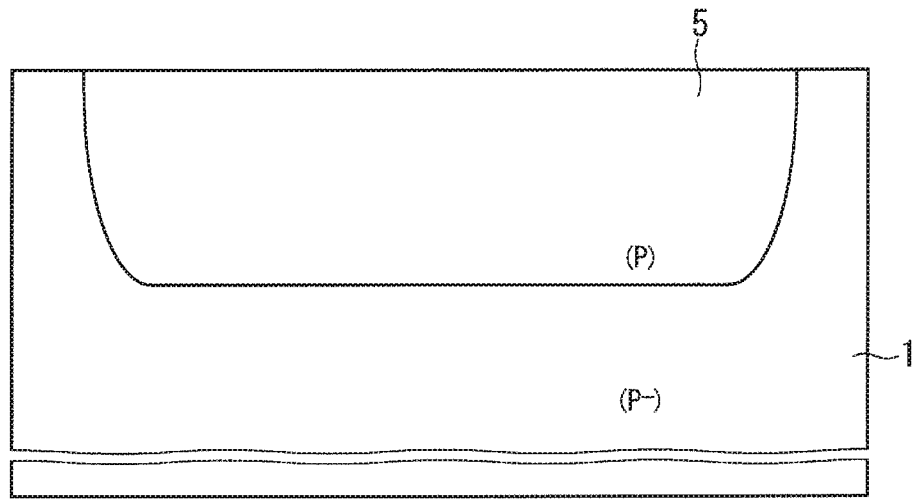
F I G. 1 6
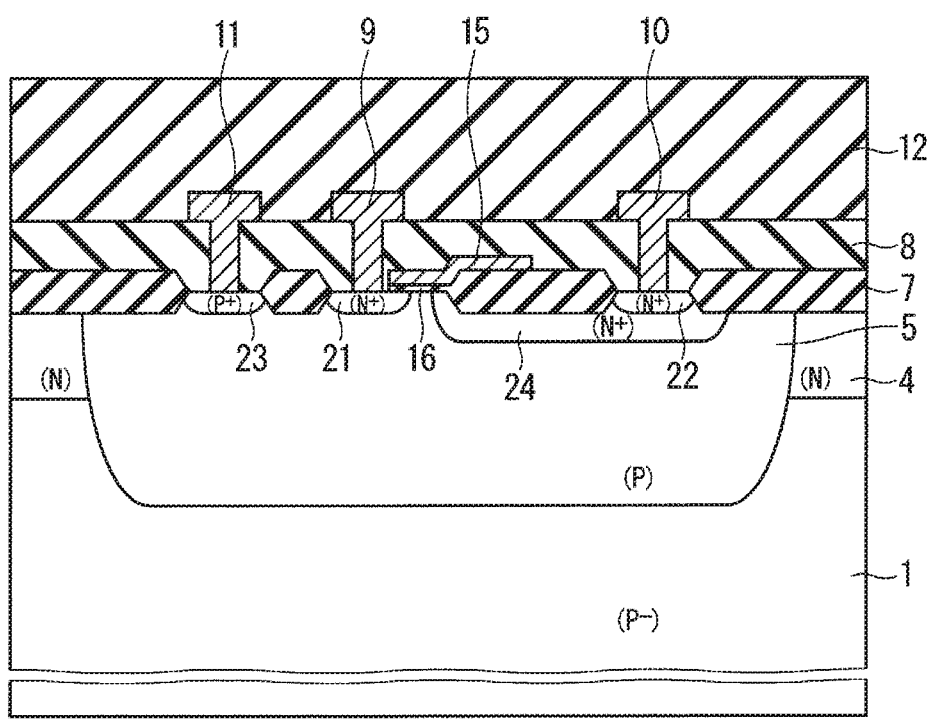

METHOD FOR MANUFACTURING SEMICONDUCTOR DEVICE, AND POWER CONVERSION DEVICE

BACKGROUND OF THE INVENTION

Field of the Invention

The present invention relates to a method for manufacturing a semiconductor device, and particularly to a method for manufacturing a semiconductor device including a buried diffusion layer.

Description of the Background Art

In an inverter including switching devices such as a metal-oxide semiconductor field-effect transistor (MOSFET) connected in a totem-pole between a high-potential main power terminal and a low-potential main power terminal where connection nodes of the switching devices are output terminals, a control circuit for controlling high-potential switching devices, which is referred to as a high voltage integrated circuit (HVIC), operates using, as a reference potential, a potential higher than a potential of a control circuit for controlling low-potential switching devices, which is referred to as a low voltage integrated circuit (LVIC).

A p-type substrate containing p-type impurities is often used as a silicon (Si) wafer for the HVIC. As disclosed in, for example, Japanese Patent Application Laid-Open No. 2004-349296, an n-type diffusion layer referred to as a buried impurity region or a buried diffusion layer is formed under a p-type well region to electrically separate the p-type substrate from the p-type well region and suppress operations of parasitic bipolar transistors.

Generally, after a buried diffusion layer is formed inside the surface of the p-type substrate, an epitaxial layer on which, for example, the MOSFET is formed is grown on the p-type substrate. Thus, problems of a prolonged procedure and increase in the manufacturing cost occur.

SUMMARY OF THE INVENTION

Provided is a method for manufacturing, with a shortened procedure, a semiconductor device including a buried diffusion layer.

The method according to the present invention is a method for manufacturing a semiconductor device including: a semiconductor substrate of a first conductivity type; an epitaxial layer of the first conductivity type, the epitaxial layer being formed on a first principal surface of the semiconductor substrate; a first semiconductor region of the first conductivity type, the first semiconductor region being formed from an outermost surface to an inner portion of the epitaxial layer; a second semiconductor region of a second conductivity type, the second semiconductor region being formed in contact with a side surface of the first semiconductor region; a source region and a drain region of the second conductivity type, the source region and the drain region being selectively formed in an upper layer portion of the first semiconductor region; a gate electrode formed on the first semiconductor region between the source region and the drain region through a gate insulating film; and a third semiconductor region of the second conductivity type, the third semiconductor region being formed from a bottom surface of the first semiconductor region to an inner portion of the semiconductor substrate, the method including the steps of: (a) polishing a second principal surface opposite to the first principal surface of the semiconductor substrate above which at least the source region, the drain region, and the gate electrode are formed to thin the semiconductor substrate; and (b) ion-implanting impurities of the second conductivity type from the second principal surface of the polished semiconductor substrate to form the third semiconductor region, wherein step (b) includes (b-1) ion-implanting the impurities of the second conductivity type so that the third semiconductor region is higher in impurity concentration than the second semiconductor region.

Since the third semiconductor region is formed by ion-implanting the impurities of the second conductivity type from the rear surface of the semiconductor substrate in the final step of the wafer processes according to the method for manufacturing the semiconductor device, the procedure is simplified, and the manufacturing cost can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a cross-sectional view illustrating a structure of a semiconductor device according to Embodiment 3 of the present invention;

FIGS. 10 to 13 are cross-sectional views illustrating a method for manufacturing the semiconductor device according to Embodiment 3 of the present invention;

FIG. 14 is a cross-sectional view illustrating a structure of a semiconductor device according to Embodiment 4 of the present invention;

FIGS. 15 to 18 are cross-sectional views illustrating a method for manufacturing the semiconductor device according to Embodiment 4 of the present invention.

DESCRIPTION OF THE PREFERRED EMBODIMENTS

Embodiment 1

Figure 1:
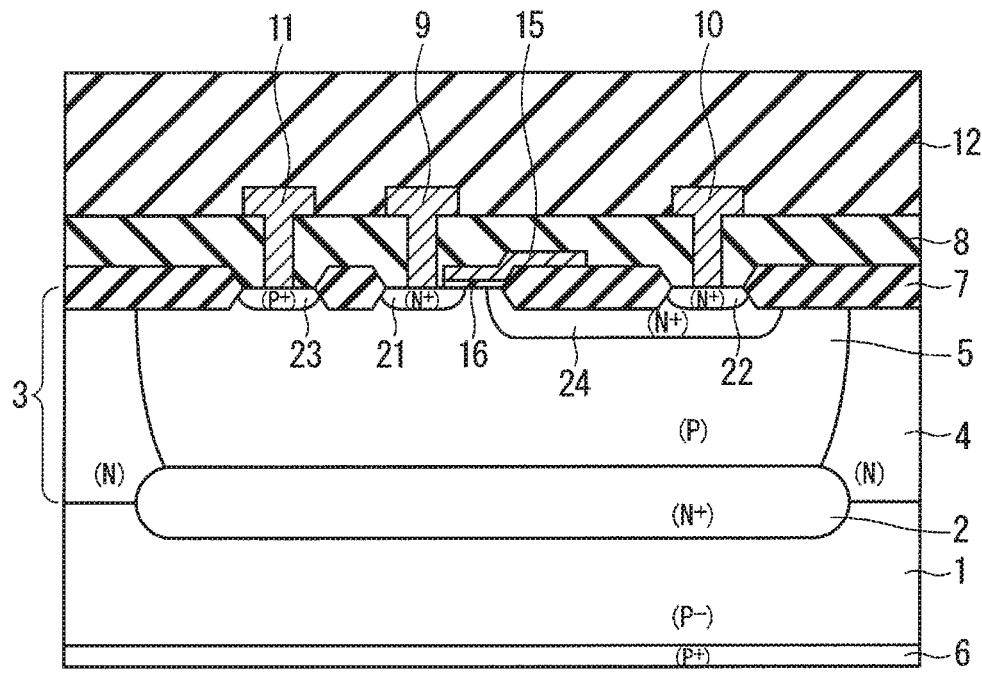
FIG. 1 is a cross-sectional view illustrating a structure of a semiconductor device according to Embodiment 1 of the present invention.

FIG. 1 is a cross-sectional view illustrating a structure of a MOSFET 100 according to Embodiment 1 of the present invention. As illustrated in FIG. 1, the MOSFET 100 is formed on a p-type epitaxial layer 3 formed on a semiconductor substrate 1 such as a silicon substrate containing relatively low p-type (first conductivity type, i.e., p) impurities.

A well region 5 (first semiconductor region) containing p-type impurities is selectively formed from the outermost surface to the inner portion of the epitaxial layer 3. A well region 4 (second semiconductor region) containing n-type (second conductivity type) impurities is formed in contact with the side surface of the well region 5. A buried diffusion layer 2 (third semiconductor region) containing relatively high n-type (n⁺) impurities is formed from the bottom surface of the well region 5 to the inner portion of the semiconductor substrate 1. The buried diffusion layer 2 has an impurity concentration ranging from $5\times10^{13}$ to $5\times10^{14}/\text{cm}^3$, which is higher than that of the well region 4.

A source region 21 and a drain region 22 that contain relatively high n-type (n⁺) impurities are selectively formed in an upper layer portion of the well region 5. The drain region 22 is formed in an upper layer portion of a device isolation region 24 containing relatively high n-type (n⁺) impurities. A back-gate region 23 containing relatively high p-type (p⁺) impurities is selectively formed in the upper layer portion of the well region 5. Although p-type is defined as the first conductivity type and n-type is defined as the second conductivity type on the conductivity type of impurities, the definitions may be reversed.

A device isolation insulating film 7 for device isolation is selectively formed on the epitaxial layer 3. The device isolation insulating film 7 isolates the source region 21, the drain region 22, and the back-gate region 23. Although the device isolation insulating film 7 can be formed by local oxidation of silicon (LOCOS) or shallow trench isolation (STI), the device isolation insulating film 7 is not essential.

The device isolation region 24 includes the drain region 22, and is formed to include a lower portion of the device isolation insulating film 7 between the source region 21 and the drain region 22. A gate electrode 15 is formed from a part of an upper portion of the device isolation insulating film 7 between the source region 21 and the drain region 22 to a part of an upper portion of the source region 21. The gate electrode 15 is formed on the well region 5 through a gate insulating film 16. The gate insulating film 16 extends from a peripheral portion of the device isolation region 24 to a peripheral portion of the source region 21. When the MOSFET 100 operates, a channel is formed in an inner portion of the well region 5 under the gate insulating film 16 and between the peripheral portion of the device isolation region 24 and the peripheral portion of the source region 21.

When the device isolation insulating film 7 is not formed, the gate electrode 15 is formed on the well region 5 between the source region 21 and the drain region 22 through the gate insulating film 16. A channel is formed in the inner portion of the well region 5 between the peripheral portion of the source region 21 and a peripheral portion of the drain region 22 under the gate insulating film 16.

An interlayer insulation film 8 is formed on the epitaxial layer 3 to cover the gate electrode 15 and the device isolation insulating film 7. A source electrode 9, a drain electrode 10, and a back-gate electrode 11 are formed to reach the source region 21, the drain region 22, and the back-gate region 23, respectively, and penetrate the interlayer insulation film 8.

A passivation film 12 that is an insulating film is formed on the interlayer insulation film 8 and also on the source electrode 9, the drain electrode 10, and the back-gate electrode 11. A semiconductor layer 6 containing relatively high p-type (p⁺) impurities is formed on the rear surface of the semiconductor substrate 1 which is opposite to the side on which the passivation film 12 is formed to function as a punch-through stopper for stopping extension of a depletion layer to prevent punch-through.

The semiconductor layer 6 can maintain a breakdown voltage. The p-type impurities of the semiconductor layer 6 have an impurity concentration ranging from $1\times10^{16}$ to $1\times10^{17}/\text{cm}^3$, which is higher than that of the semiconductor substrate 1.

The buried diffusion layer 2 is formed at a depth of approximately 10 μm from the outermost surface of the epitaxial layer 3, and communicates to the well region 4 formed inside the epitaxial layer 3. This buried diffusion layer 2 electrically isolates the well region 5 formed in the epitaxial layer 3 from the semiconductor substrate 1.

Figure 2:
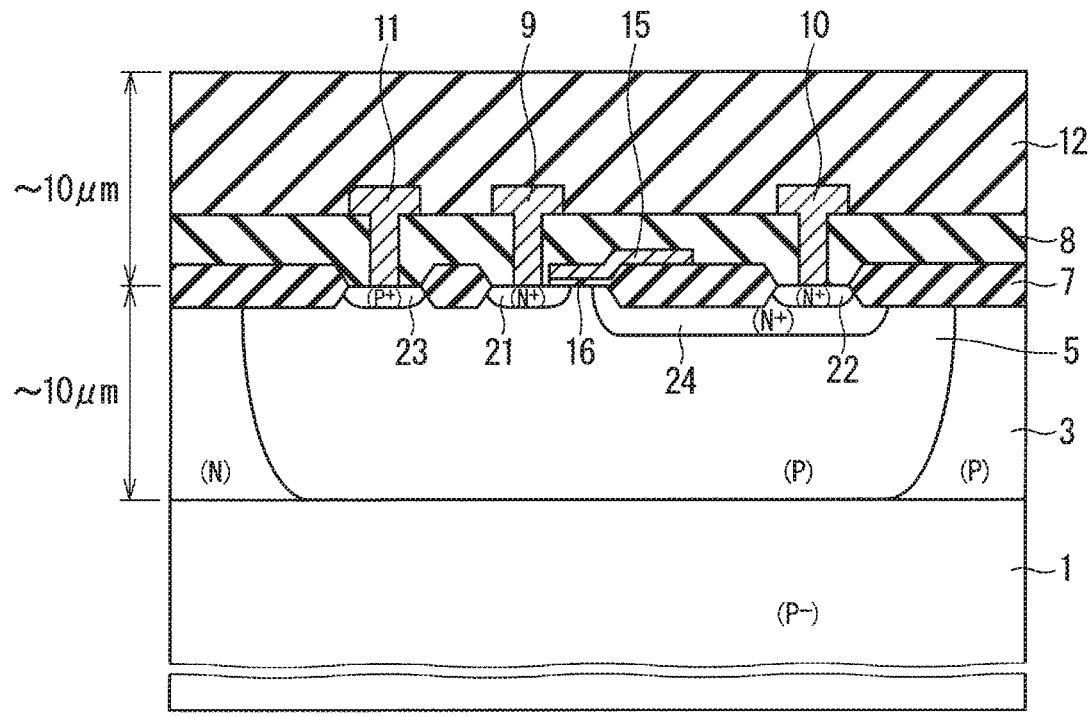
FIGS. 2 to 4 are cross-sectional views illustrating a method for manufacturing the semiconductor device according to Embodiment 1 of the present invention.

Next, a method for manufacturing the MOSFET 100 will be described with reference to FIGS. 2 to 4. First in the step illustrated in FIG. 2, the epitaxial layer 3 of p-type is formed on the first principal surface (front surface) of the semiconductor substrate 1 of p-type. The epitaxial layer 3 is approximately 10 μm thick. P-type impurities are selectively ion-implanted from the upper surface of the epitaxial layer 3 to form the well region 5 of p-type. Further, n-type impurities are selectively ion-implanted to form the well region 4 of n-type in contact with the side surface of the well region 5.

Then, the device isolation region 24 is selectively formed by ion-implanting impurities in the upper layer portion of the well region 5. The device isolation insulating film 7 is selectively formed on the epitaxial layer 3 by LOCOS or STI. Then, the source region 21, the drain region 22, and the back-gate region 23 are formed by ion-implanting impurities in a region where the device isolation insulating film 7 is not formed. After formation of the device isolation insulating film 7, a silicon oxide film is formed above the epitaxial layer 3. After formation of the source region 21, the silicon oxide film is selectively removed so that the silicon oxide film remains from the peripheral portion of the device isolation region 24 to the peripheral portion of the source region 21 to form the gate insulating film 16.

After formation of the gate electrode 15 on the gate insulating film 16 and on the part of the upper portion of the device isolation insulating film 7, the interlayer insulation film 8 is formed from, for example, the silicon oxide film to cover the gate electrode 15 and the device isolation insulating film 7.

Next, contact holes are formed to reach the source region 21, the drain region 22, and the back-gate region 23 and penetrate the interlayer insulation film 8. Then, a conductive film is formed on the interlayer insulation film 8 to fill the contact holes. Although another contact hole is formed to reach the gate electrode 15 and the conductive film is also buried in the contact hole, the illustration will be omitted.

Next, the conductive film is patterned to form the source electrode 9, the drain electrode 10, and the back-gate electrode 11. The passivation film 12 is formed from, for example, the silicon oxide film to cover these electrodes. The total thickness of the interlayer insulation film 8 and the passivation film 12 is approximately 10 μm.

A known conventional technology in the field of semiconductor devices can be used to manufacture the constituent elements of the MOSFET 100. Since a skilled person in the art can appropriately determine, for example, the type of impurities, impurity concentrations, thicknesses of the impurity layers, the detailed description will be omitted.

Figure 3:
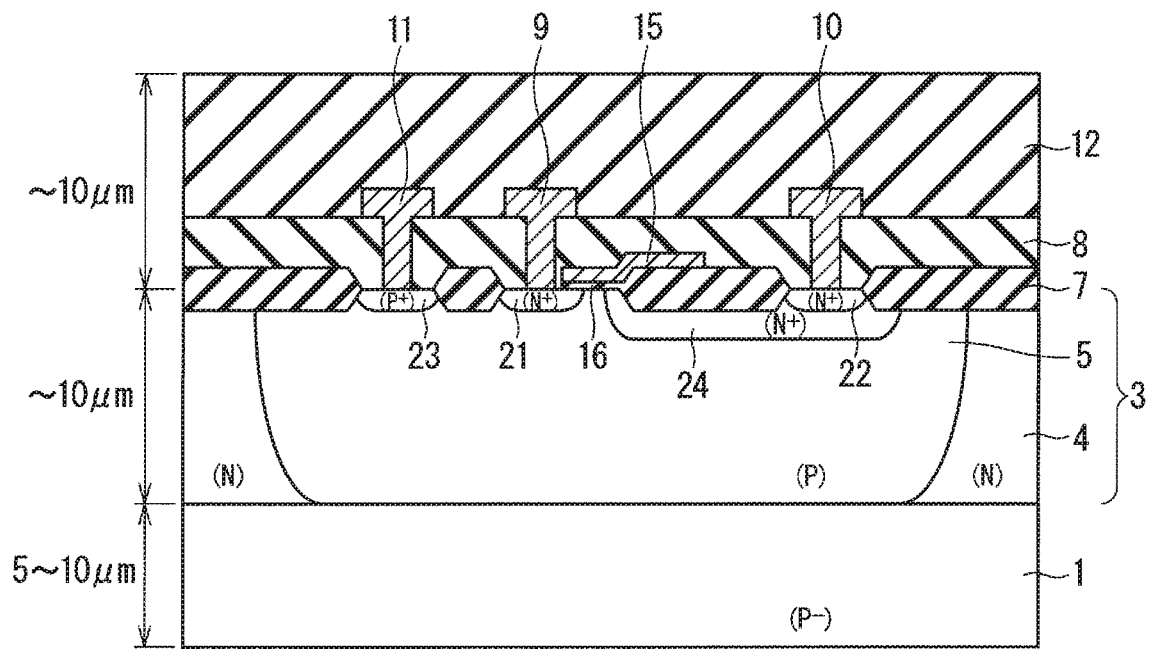

Next, while the passivation film 12 is protected by, for example, an adhesive tape, the second principal surface (rear surface) of the semiconductor substrate 1 is polished using an ultra-thin wafer formation technology to thin the semiconductor substrate 1 approximately to 5 to 10 μm as illustrated in FIG. 3.

Figure 4:
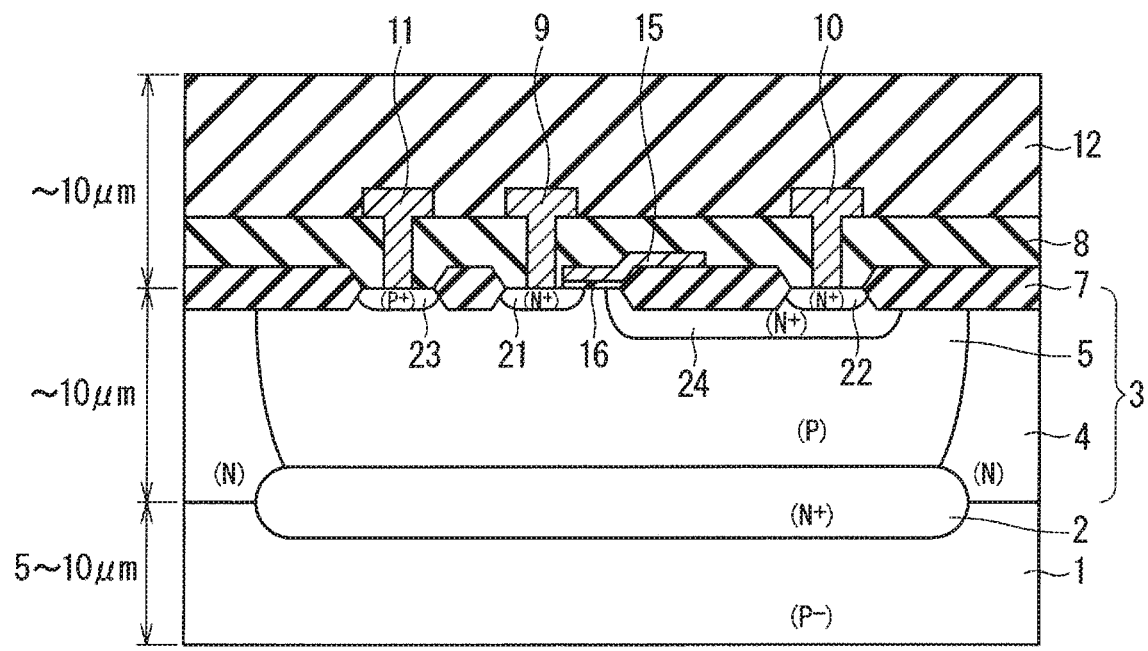

Then in the step illustrated in FIG. 4, n-type impurities are ion-implanted from the rear surface of the semiconductor substrate 1 to selectively form the buried diffusion layer 2 at a distance of approximately 10 µm from the rear surface of the semiconductor substrate 1. The n-type impurities to be ion-implanted are, for example, phosphorous (P) which requires approximately 5 MeV as the implantation energy.

When hydrogen (proton) is used as the n-type impurities, the proton range in the silicon substrate with approximately 2 MeV of the implantation energy is approximately 30 µm. Thus, the semiconductor substrate 1 may be approximately 30 µm thick, and the buried diffusion layer 2 may be formed at a distance of approximately 30 µm from the rear surface of the semiconductor substrate 1.

Finally, p-type impurities are ion-implanted from the rear surface of the semiconductor substrate 1 to form the semiconductor layer 6 functioning as a punch-through stopper inside the rear surface of the semiconductor substrate 1, thus resulting in the MOSFET 100 illustrated in FIG. 1.

According to the method for manufacturing the semiconductor device in Embodiment 1 described above, after formation of the constituent elements of the MOSFET 100, n-type impurities are ion-implanted from the rear surface of the semiconductor substrate 1 in the final step of the wafer processes to form the buried diffusion layer 2. Thus, the procedure is simplified, and the manufacturing cost can be reduced. When the buried diffusion layer 2 needs to be formed distant from the front surface of the semiconductor substrate 1, a thick epitaxial layer needs to be formed in the conventional manufacturing method, which further prolongs the procedure. However, the method for forming the buried diffusion layer 2 by ion-implanting impurities from the rear surface of the semiconductor substrate 1 never prolongs the procedure. The manufacturing method according to Embodiment 1 is effective as an alternative manufacturing method when the conventional manufacturing method cannot be applied.

The buried diffusion layer 2 in the MOSFET 100 illustrated in FIG. 1 electrically isolates the well region 5 from the semiconductor substrate 1. Thus, a back-gate potential can be applied to the well region 5 separately from the substrate potential to be applied to the semiconductor substrate 1.

Embodiment 2

Figure 5:
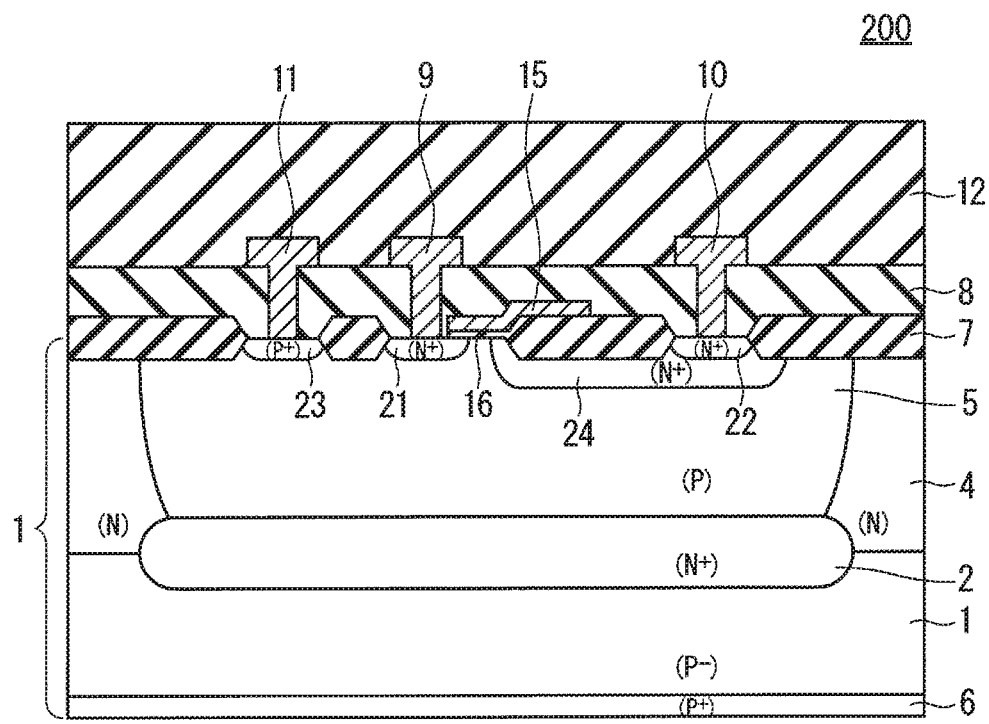
FIG. 5 is a cross-sectional view illustrating a structure of a semiconductor device according to Embodiment 2 of the present invention.

FIG. 5 is a cross-sectional view illustrating a structure of a MOSFET 200 according to Embodiment 2 of the present invention. In FIG. 5, the same reference numerals are used for the same structures as those of the MOSFET 100 described with reference to FIG. 1, and the overlapping description will be omitted.

As illustrated in FIG. 5, the MOSFET 200 does not include the epitaxial layer 3 on the semiconductor substrate 1, and the constituent elements of the MOSFET 200 are formed on the semiconductor substrate 1. In other words, the well region 5 containing p-type impurities is selectively formed from the outermost surface of the first principal surface (front surface) to the inner portion of the semiconductor substrate 1. The well region 4 containing n-type impurities is formed in contact with the side surface of the well region 5. The buried diffusion layer 2 containing relatively high n-type (n⁺) impurities is formed inside the semiconductor substrate 1 to be in contact with the bottom surface of the well region 5. The source region 21, the drain region 22, the back-gate region 23, and the device isolation region 24 are formed in the upper layer portion of the well region 5.

The device isolation insulating film 7 for device isolation is selectively formed on the first principal surface of the semiconductor substrate 1 to isolate the source region 21, the drain region 22, and the back-gate region 23.

The interlayer insulation film 8 is formed on the semiconductor substrate 1 to cover the gate electrode 15 and the device isolation insulating film 7. The source electrode 9, the drain electrode 10, and the back-gate electrode 11 are formed to reach the source region 21, the drain region 22, and the back-gate region 23, respectively, and penetrate the interlayer insulation film 8.

The buried diffusion layer 2 is formed at a depth of approximately 10 µm from the outermost surface of the first principal surface of the semiconductor substrate 1, and communicates to the well region 4 formed inside the semiconductor substrate 1. This buried diffusion layer 2 electrically isolates the well region 5 formed in the semiconductor substrate 1 from the semiconductor substrate 1 under the buried diffusion layer 2.

Figure 6:
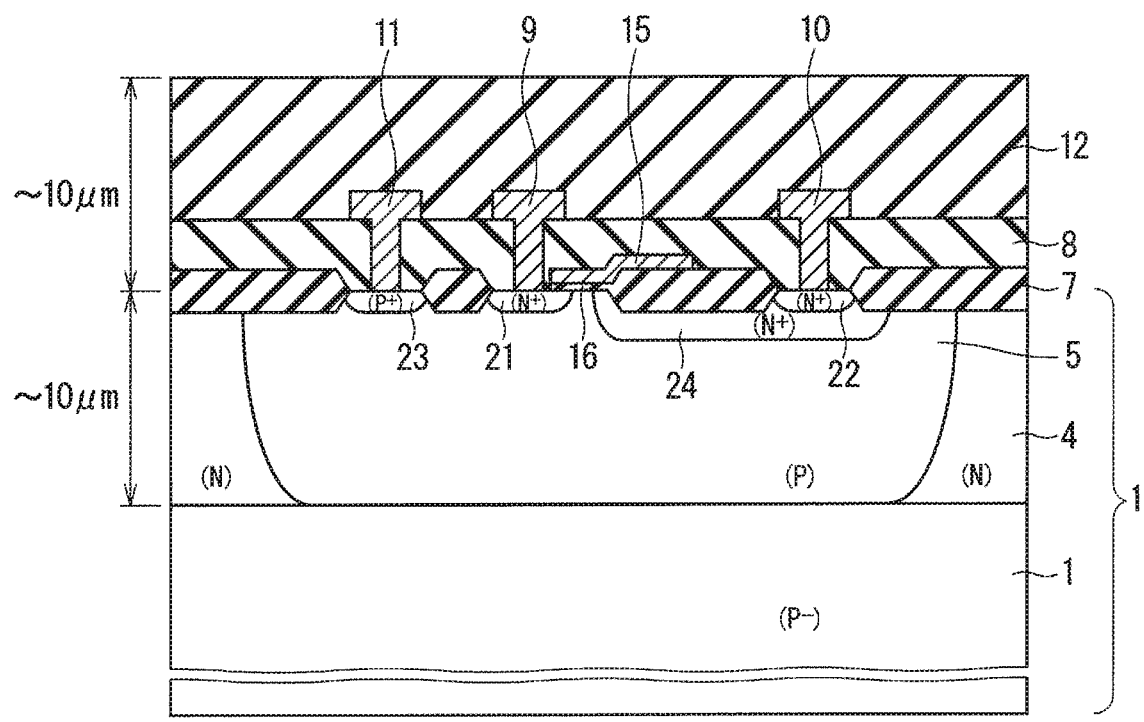
FIGS. 6 to 8 are cross-sectional views illustrating a method for manufacturing the semiconductor device according to Embodiment 2 of the present invention.

Next, a method for manufacturing the MOSFET 200 will be described with reference to FIGS. 6 to 8. First in the step illustrated in FIG. 6, p-type impurities are selectively ion-implanted from the first principal surface (front surface) of the semiconductor substrate 1 of p-type to form the well region 5 of p-type. Further, n-type impurities are selectively ion-implanted to form the well region 4 of n-type in contact with the side surface of the well region 5.

Since the steps for forming, in the upper layer portion of the well region 5, the impurity regions such as the source region 21 and for forming, for example, the interlayer insulation film 8 and the source electrode 9 on the first principal surface of the semiconductor substrate 1 are the same as those for forming the MOSFET 100 described with reference to FIG. 2, the description will be omitted.

Figure 7:
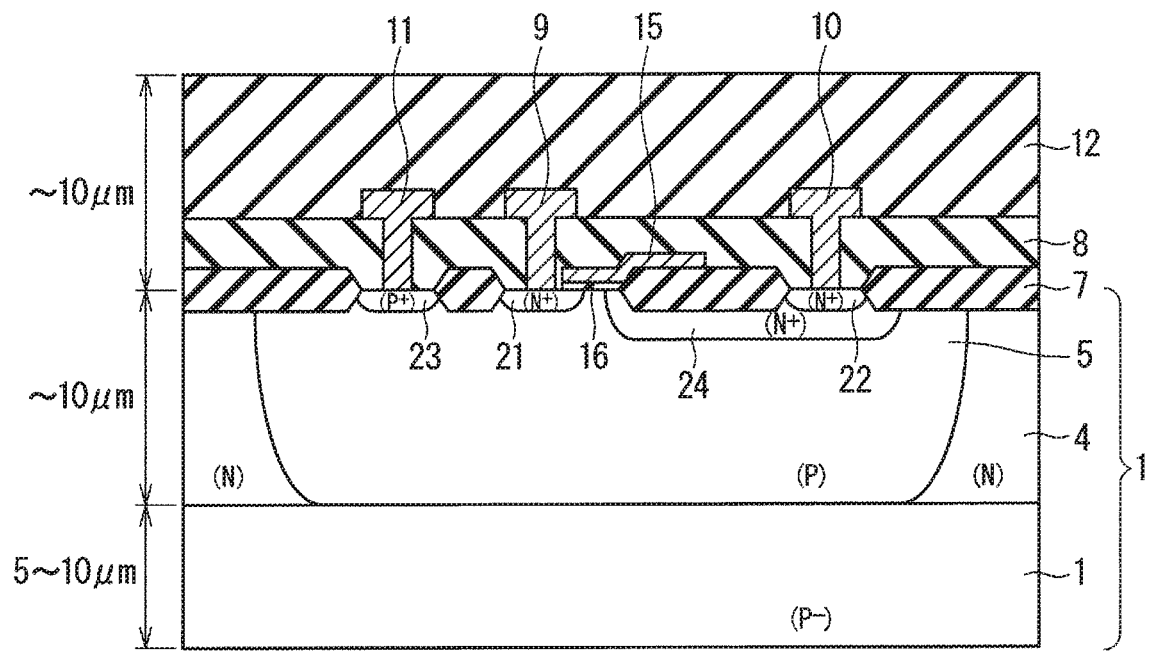

Next, while the passivation film 12 is protected by, for example, an adhesive tape, the second principal surface (rear surface) of the semiconductor substrate 1 is polished using the ultra-thin wafer formation technology to thin the semiconductor substrate 1 approximately to 20 µm as illustrated in FIG. 7.

Figure 8:
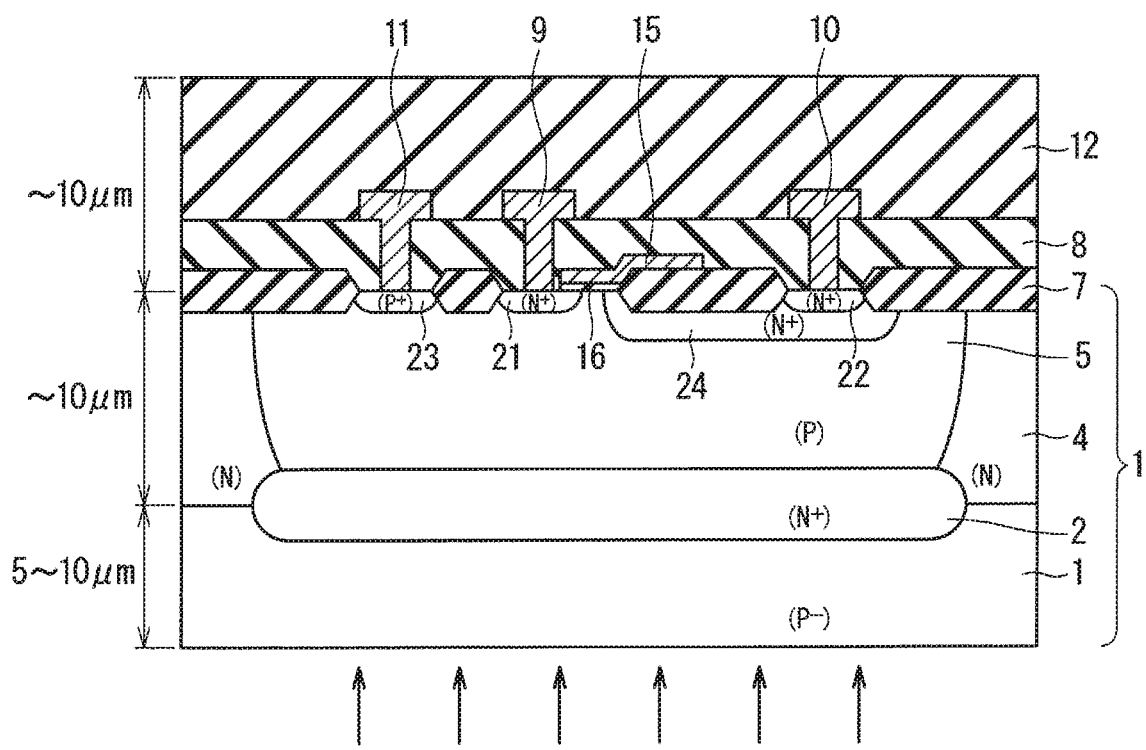

Then in the step illustrated in FIG. 8, n-type impurities are ion-implanted from the rear surface of the semiconductor substrate 1 to selectively form the buried diffusion layer 2 at a distance of approximately 10 µm from the rear surface of the semiconductor substrate 1. The n-type impurities to be ion-implanted are, for example, phosphorous (P) which requires approximately 5 MeV as the implantation energy.

When hydrogen (proton) is used as the n-type impurities, the proton range in the silicon substrate with approximately 2 MeV of the implantation energy is approximately 30 µm. Thus, the semiconductor substrate 1 may be approximately 30 µm thick, and the buried diffusion layer 2 may be formed at a distance of approximately 30 µm from the rear surface of the semiconductor substrate 1.

Finally, p-type impurities are ion-implanted from the rear surface of the semiconductor substrate 1 to form the semiconductor layer 6 functioning as a punch-through stopper inside the rear surface of the semiconductor substrate 1, thus resulting in the MOSFET 200 illustrated in FIG. 5.

According to the method for manufacturing the semiconductor device in Embodiment 2 described above, after formation of the constituent elements of the MOSFET 200, n-type impurities are ion-implanted from the rear surface of the semiconductor substrate 1 in the final step of the wafer processes to form the buried diffusion layer 2. Thus, the procedure is simplified, and the manufacturing cost can be reduced.

Since the epitaxial layer is not formed on the semiconductor substrate 1, the procedure is further simplified, and the manufacturing cost can be further reduced.

Similarly as Embodiment 1, the manufacturing method according to Embodiment 2 is effective as an alternative manufacturing method when the conventional manufacturing method cannot be applied.

The buried diffusion layer 2 in the MOSFET 200 illustrated in FIG. 5 electrically isolates the well region 5 from the semiconductor substrate 1. Thus, the back-gate potential can be applied to the well region 5 separately from the substrate potential to be applied to the semiconductor substrate 1.

Embodiment 3

FIG. 9 is a cross-sectional view illustrating a structure of a MOSFET 300 according to Embodiment 3 of the present invention. In FIG. 9, the same reference numerals are used for the same structures as those of the MOSFET 100 described with reference to FIG. 1, and the overlapping description will be omitted.

As illustrated in FIG. 9, the constituent elements of the MOSFET 300 are formed on the epitaxial layer 3 formed on the first principal surface (front surface) of the semiconductor substrate 1, which is the same as that of the MOSFET 100 according to Embodiment 1.

Further, the buried diffusion layer 2 containing relatively high n-type ($n^+$) impurities is formed from the bottom surface of the well region 5 to the inner portion of the semiconductor substrate 1. Moreover, a buried diffusion layer 13 (fourth semiconductor region) containing relatively high n-type ($n^+$) impurities is formed in contact with the bottom surface of the well region 4 in the epitaxial layer 3.

The buried diffusion layer 2 is formed at a depth of approximately 10 μm from the outermost surface of the first principal surface of the semiconductor substrate 1. The buried diffusion layer 13 is formed shallower than the buried diffusion layer 2 with respect the outermost surface of the epitaxial layer 3, and communicates to the buried diffusion layer 2. The buried diffusion layers 2 and 13 electrically isolate the well region 5 formed in the epitaxial layer 3 from the semiconductor substrate 1. The buried diffusion layers 2 and 13 have an impurity concentration ranging from $5 \times 10^{13}$ to $5 \times 10^{14}/cm^3$, which is higher than that of the well region 4.

Next, a method for manufacturing the MOSFET 300 will be described with reference to FIGS. 10 to 13. First in the step illustrated in FIG. 10, the epitaxial layer 3 of p-type is formed on the first principal surface (front surface) of the semiconductor substrate 1 of p-type. The epitaxial layer 3 is approximately 10 μm thick. P-type impurities are selectively ion-implanted from the upper surface of the epitaxial layer 3 to form the well region 5 of p-type.

Next, n-type impurities are selectively ion-implanted to form the well region 4 of n-type in contact with the side surface of the well region 5. Here, the well region 4 does not have to be formed to cover the entire region of the epitaxial layer 3 in the thickness direction. The epitaxial layer 3 may remain in the lower portion of the well region 4.

Figure 11:
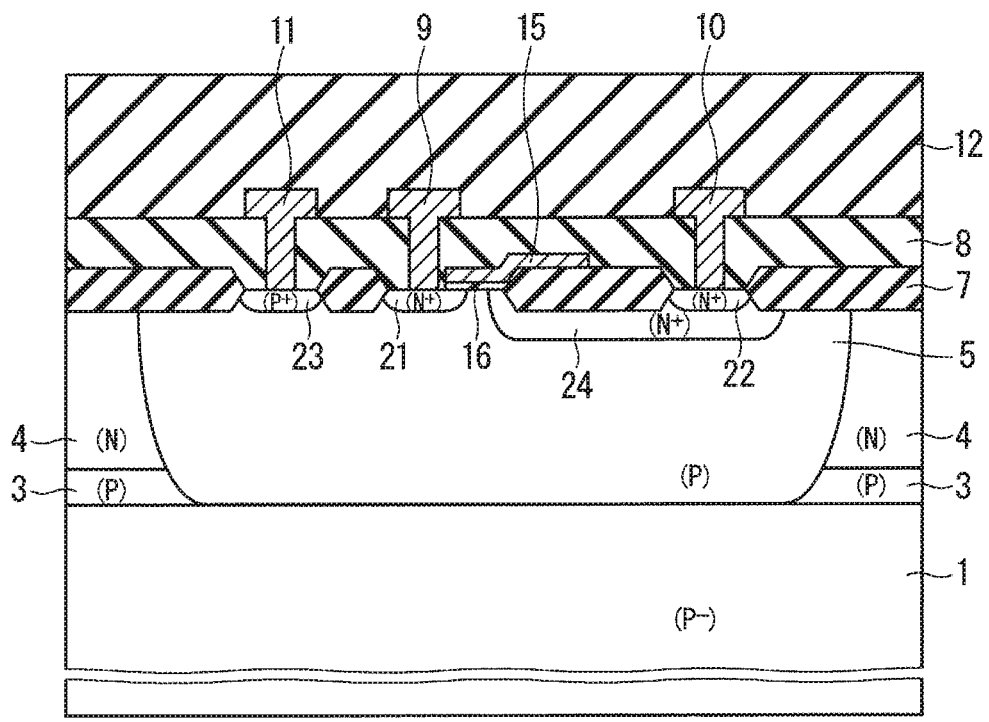

Subsequently, forming, in the upper layer portion of the well region 5, the impurity regions such as the source region 21 and forming, for example, the interlayer insulation film 8 and the source electrode 9 above the first principal surface of the semiconductor substrate 1 result in the structure illustrated in FIG. 11. Since these forming steps are the same as those for forming the MOSFET 100 described with reference to FIG. 2, the description will be omitted.

Figure 12:
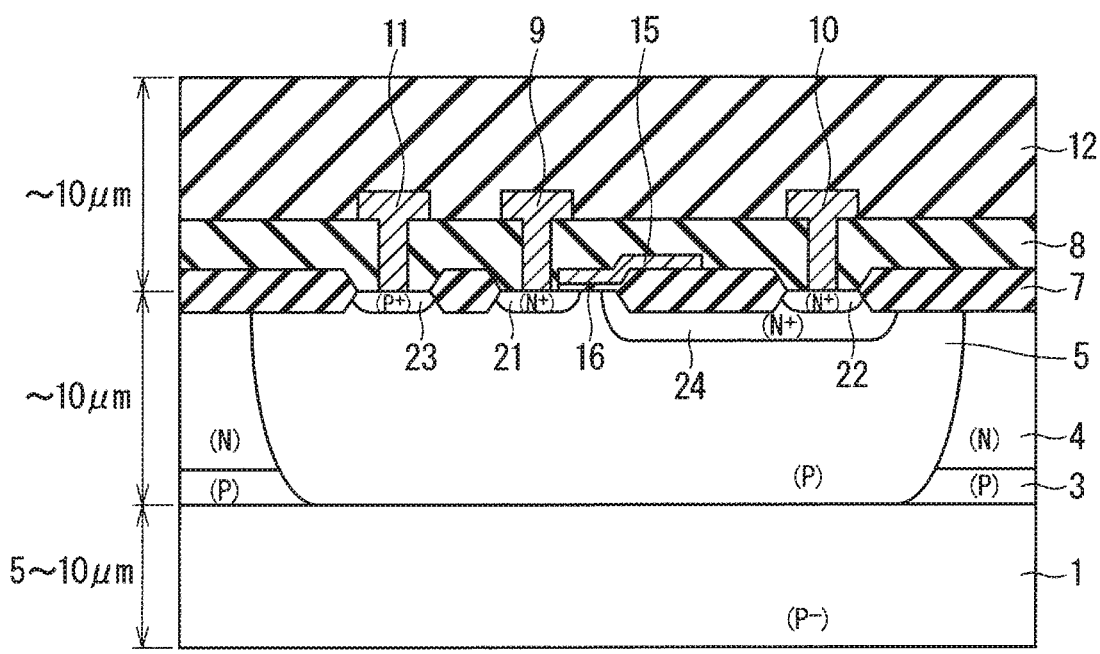
Figure 17:
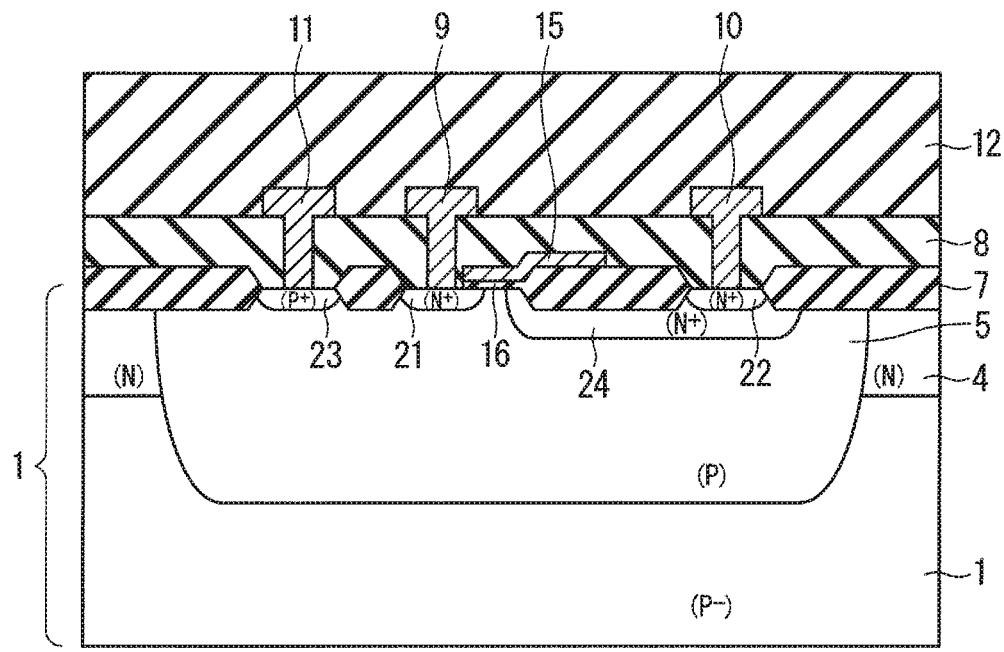

Next, while the passivation film 12 is protected by, for example, an adhesive tape, the second principal surface (rear surface) of the semiconductor substrate 1 is polished using the ultra-thin wafer formation technology to thin the semiconductor substrate 1 approximately to 5 to 10 μm as illustrated in FIG. 12.

Then in the step illustrated in FIG. 13, n-type impurities are ion-implanted from the rear surface of the semiconductor substrate 1 to selectively form the buried diffusion layer 2 at a distance of approximately 10 μm from the rear surface of the semiconductor substrate 1. The n-type impurities to be ion-implanted are, for example, phosphorous (P) which requires approximately 5 MeV as the implantation energy.

When hydrogen (proton) is used as the n-type impurities, the proton range in the silicon substrate with approximately 2 MeV of the implantation energy is approximately 30 μm. Thus, the semiconductor substrate 1 may be approximately 30 μm thick, and the buried diffusion layer 2 may be formed at a distance of approximately 30 μm from the rear surface of the semiconductor substrate 1.

Similarly, n-type impurities are ion-implanted from the rear surface of the semiconductor substrate 1 to selectively form the buried diffusion layer 13 at a distance of approximately a dozen or more μm from the rear surface of the semiconductor substrate 1. Here, the buried diffusion layer 13 is formed to communicate to the buried diffusion layer 2 as well as the well region 4. The n-type impurities to be ion-implanted are, for example, phosphorous (P) which requires approximately 5 MeV as the implantation energy.

Finally, p-type impurities are ion-implanted from the rear surface of the semiconductor substrate 1 to form the semiconductor layer 6 functioning as a punch-through stopper inside the rear surface of the semiconductor substrate 1, thus resulting in the MOSFET 300 illustrated in FIG. 9.

According to the method for manufacturing the semiconductor device in Embodiment 3 described above, after formation of the constituent elements of the MOSFET 300, n-type impurities are ion-implanted from the rear surface of the semiconductor substrate 1 in the final step of the wafer processes to form the buried diffusion layers 2 and 13. Thus, the procedure is simplified, and the manufacturing cost can be reduced.

Since the well region 4 does not have to be formed to cover the entire region of the epitaxial layer 3 in the thickness direction in the presence of the buried diffusion layer 13, the well region 4 is easily formed. Since the acceleration energy of implanted ions to be used for forming the well region 4 is reduced, an advantage of reducing crystal defects is also produced.

Similarly as Embodiment 1, the manufacturing method according to Embodiment 3 is effective as an alternative manufacturing method when the conventional manufacturing method cannot be applied.

The buried diffusion layers 2 and 13 in the MOSFET 300 illustrated in FIG. 9 electrically isolate the well region 5 from the semiconductor substrate 1. Thus, the back-gate potential can be applied to the well region 5 separately from the substrate potential to be applied to the semiconductor substrate 1.

Embodiment 4

FIG. 14 is a cross-sectional view illustrating a structure of a MOSFET 400 according to Embodiment 4 of the present invention. In FIG. 14, the same reference numerals are used for the same structures as those of the MOSFET 300 described with reference to FIG. 9, and the overlapping description will be omitted.

As illustrated in FIG. 14, the MOSFET 400 does not include the epitaxial layer 3 on the semiconductor substrate 1, and the constituent elements of the MOSFET 400 are formed on the semiconductor substrate 1. In other words, the well region 5 containing p-type impurities is selectively formed from the outermost surface to the first principal surface (front surface) to the inner portion of the semiconductor substrate 1. The well region 4 containing n-type impurities is formed in contact with the side surface of the well region 5. The buried diffusion layers 2 and 13 containing relatively high n-type ($n^+$) impurities are formed inside the semiconductor substrate 1 to be in contact with the bottom surface of the well region 5. The source region 21, the drain region 22, the back-gate region 23, and the device isolation region 24 are formed in the upper layer portion of the well region 5.

The device isolation insulating film 7 for device isolation is selectively formed on the first principal surface of the semiconductor substrate 1 to isolate the source region 21, the drain region 22, and the back-gate region 23.

The interlayer insulation film 8 is formed on the semiconductor substrate 1 to cover the gate electrode 15 and the device isolation insulating film 7. The source electrode 9, the drain electrode 10, and the back-gate electrode 11 are formed to reach the source region 21, the drain region 22, and the back-gate region 23, respectively, and penetrate the interlayer insulation film 8.

The buried diffusion layer 2 is formed at a depth of approximately 10 μm from the outermost surface of the first principal surface of the semiconductor substrate 1. The buried diffusion layer 13 is formed shallower than the buried diffusion layer 2 with respect the outermost surface of the first principal surface of the semiconductor substrate 1, and communicates to the buried diffusion layer 2. The buried diffusion layers 2 and 13 electrically isolate the well region 5 formed in the semiconductor substrate 1 from the semiconductor substrate 1 under the buried diffusion layer 2.

Next, a method for manufacturing the MOSFET 400 will be described with reference to FIGS. 15 to 18. First in the step illustrated in FIG. 15, p-type impurities are selectively ion-implanted from the first principal surface (front surface) of the semiconductor substrate 1 of p-type to form the well region 5 of p-type.

Next, n-type impurities are selectively ion-implanted to form the well region 4 of n-type in contact with the side surface of the well region 5. Here, the well region 4 does not have to be formed as thick as the well region 5.

Subsequently, forming, in the upper layer portion of the well region 5, the impurity regions such as the source region 21 and forming, for example, the interlayer insulation film 8 and the source electrode 9 on the first principal surface of the semiconductor substrate 1 result in the structure illustrated in FIG. 16. Since these forming steps are the same as those for forming the MOSFET 100 described with reference to FIG. 2, the description will be omitted.

Next, while the passivation film 12 is protected by, for example, an adhesive tape, the second principal surface (rear surface) of the semiconductor substrate 1 is polished using the ultra-thin wafer formation technology to thin the semiconductor substrate 1 approximately to 20 μm.

Figure 18:
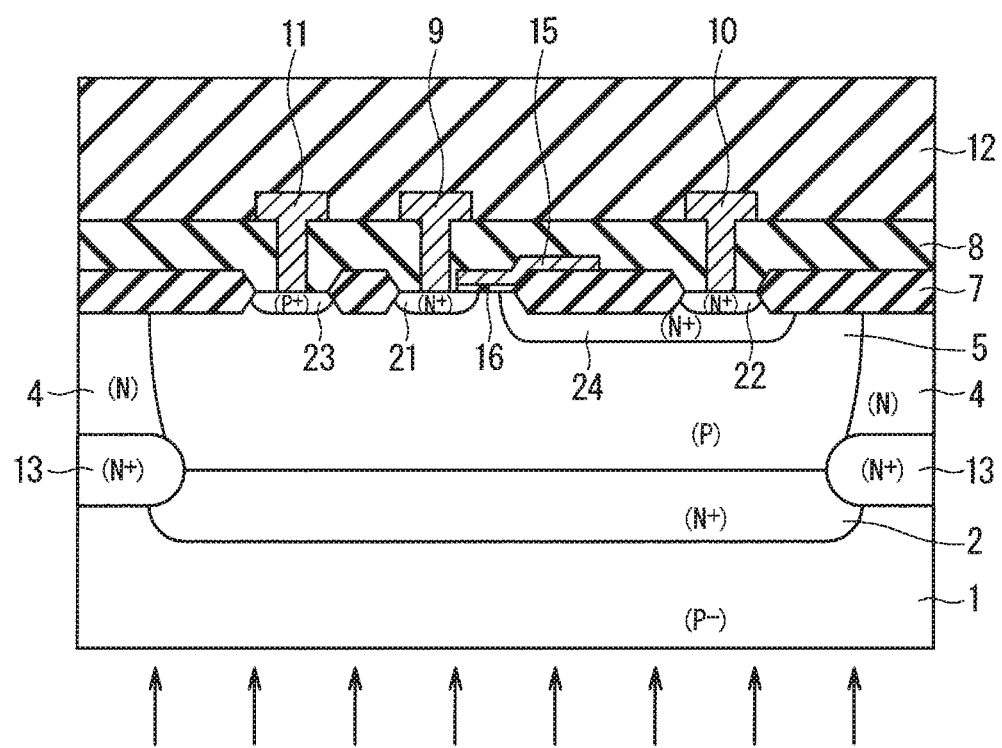

Then in the step illustrated in FIG. 18, n-type impurities are ion-implanted from the rear surface of the semiconductor substrate 1 to selectively form the buried diffusion layer 2 at a distance of approximately 10 μm from the rear surface of the semiconductor substrate 1. The n-type impurities to be ion-implanted are, for example, phosphorous (P) which requires approximately 5 MeV as the implantation energy.

When hydrogen (proton) is used as the n-type impurities, the proton range in the silicon substrate with approximately 2 MeV of the implantation energy is approximately 30 μm. Thus, the semiconductor substrate 1 may be approximately 30 μm thick, and the buried diffusion layer 2 may be formed at a distance of approximately 30 μm from the rear surface of the semiconductor substrate 1.

Similarly, n-type impurities are ion-implanted from the rear surface of the semiconductor substrate 1 to selectively form the buried diffusion layer 13 at a distance of approximately a dozen or more μm from the rear surface of the semiconductor substrate 1. Here, the buried diffusion layer 13 is formed to communicate to the buried diffusion layer 2 as well as the well region 4. The n-type impurities to be ion-implanted are, for example, phosphorous (P) which requires approximately 5 MeV as the implantation energy.

Finally, p-type impurities are ion-implanted from the rear surface of the semiconductor substrate 1 to form the semiconductor layer 6 functioning as a punch-through stopper inside the rear surface of the semiconductor substrate 1, thus resulting in the MOSFET 400 illustrated in FIG. 14.

According to the method for manufacturing the semiconductor device in Embodiment 4 described above, after formation of the constituent elements of the MOSFET 400, n-type impurities are ion-implanted from the rear surface of the semiconductor substrate 1 in the final step of the wafer processes to form the buried diffusion layers 2 and 13. Thus, the procedure is simplified, and the manufacturing cost can be reduced.

Since the epitaxial layer is not formed on the semiconductor substrate 1, the procedure is further simplified, and the manufacturing cost can be further reduced.

Since the well region 4 does not have to be formed as thick as the well region 5 in the presence of the buried diffusion layer 13, the well region 4 is easily formed. Since the acceleration energy of implanted ions to be used for forming the well region 4 is reduced, the advantage of reducing crystal defects is also produced.

Similarly as Embodiment 1, the manufacturing method according to Embodiment 4 is effective as an alternative manufacturing method when the conventional manufacturing method cannot be applied.

The buried diffusion layers 2 and 13 in the MOSFET 400 illustrated in FIG. 14 electrically isolate the well region 5 from the semiconductor substrate 1. Thus, the back-gate potential can be applied to the well region 5 separately from the substrate potential to be applied to the semiconductor substrate 1.

Embodiment 5

Embodiment 5 will describe a power conversion device to which the semiconductor devices according to Embodiments 1 to 4 are applied. Although the semiconductor devices according to Embodiments 1 to 4 are not limited to specific power conversion devices, Embodiment 5 will describe application of the semiconductor devices according to Embodiments 1 to 4 to a three-phase inverter.

Figure 19:
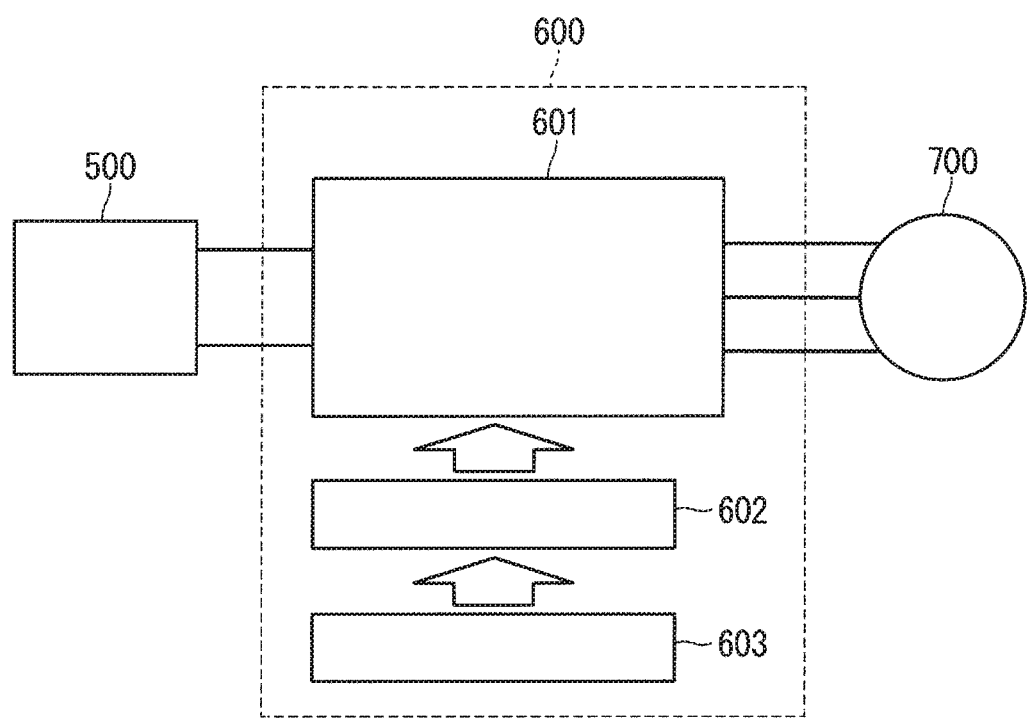
FIG. 19 is a block diagram illustrating a configuration of a power conversion system according to Embodiment 5 of the present invention.

FIG. 19 is a block diagram illustrating a configuration of a power conversion system to which the power conversion device according to Embodiment 5 is applied.

The power conversion system illustrated in FIG. 19 includes a power supply 500, a power conversion device 600, and a load 700. The power supply 500, which is a DC power supply, supplies a DC power to the power conversion device 600. The power supply 500 may include various components such as a DC system, a solar battery, or a rechargeable battery, or a rectifying circuit connected to an AC system and an AC/DC converter. The power supply 500 may include a DC/DC converter which converts the DC power output from a DC system into a predetermined power.

The power conversion device 600, which is a three-phase inverter connected between the power supply 500 and the load 700, converts the DC power supplied from the power supply 500 into the AC power to supply the AC power to the load 700. As illustrated in FIG. 19, the power conversion device 600 includes a main conversion circuit 601 that converts the DC power into the AC power, a drive circuit 602 that outputs a driving signal for driving each switching device in the main conversion circuit 601, and a control circuit 603 that outputs, to the drive circuit 602, a control signal for controlling the drive circuit 602.

The load 700 is a three-phase electrical motor driven by the AC power supplied from the power conversion device 600. The load 700 is not limited to specific use but is an electrical motor mounted on various types of electrical devices. Thus, the load 700 is used as an electrical motor for, for example, a hybrid car, an electrical car, a rail vehicle, an elevator, or air-conditioning equipment.

The power conversion device 600 will be described in detail hereinafter. The main conversion circuit 601 includes the switching devices and free-wheeling diodes (not shown). The DC power supplied from the power supply 500 is converted into the AC power by switching of the switching devices. The AC power is then supplied to the load 700. The specific circuit configuration of the main conversion circuit 601 is of various types. The main conversion circuit 601 according to Embodiment 5 is a three-phase full-bridge circuit having two levels, and includes six switching devices and six free-wheeling diodes anti-parallel connected to the respective switching devices. The semiconductor device according to any one of Embodiments 1 to 4 is applied to each of the switching devices in the main conversion circuit 601. The six switching devices form three pairs of upper and lower arms in each pair of which the two switching devices are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 601 are connected to the load 700.

The drive circuit 602 generates drive signals for driving the switching devices of the main conversion circuit 601, and provides the drive signals to control electrodes of the switching devices of the main conversion circuit 601. Specifically, the drive circuit 602 outputs the drive signal for switching each of the switching devices to an ON state and the drive signal for switching the switching device to an OFF state, to a control electrode of the switching device in accordance with the control signal from the control circuit 603 to be described hereinafter. When the switching device is kept in the ON state, the drive signal is a voltage signal (ON signal) higher than or equal to a threshold voltage of the switching device. When the switching device is kept in the OFF state, the drive signal is a voltage signal (OFF signal) lower than the threshold voltage of the switching device.

The control circuit 603 controls the switching devices of the main conversion circuit 601 to supply a desired power to the load 700. Specifically, the control circuit 603 calculates a time (ON time) when each of the switching devices of the main conversion circuit 601 needs to enter the ON state, based on the power which needs to be supplied to the load 700. For example, the main conversion circuit 601 can be controlled by performing PWM control for modulating the ON time of the switching devices in accordance with the voltage which needs to be output. Then, the control circuit 603 outputs a control instruction (control signal) to the drive circuit 602 so that the drive circuit 602 outputs the ON signal to the switching device which needs to enter the ON state and outputs the OFF signal to the switching device which needs to enter the OFF state at each time. The drive circuit 602 outputs the ON signal or the OFF signal as the drive signal to the control electrode of each of the switching devices in accordance with this control signal.

Since the semiconductor device according to any one of Embodiments 1 to 4 is applied to the power conversion device according to Embodiment 5 as the switching device in the main conversion circuit 601, the well region 5 can be electrically isolated from the semiconductor substrate 1, and the back-gate potential can be applied to the well region 5 separately from the substrate potential to be applied to the semiconductor substrate 1.

Although Embodiment 5 describes the example of applying the semiconductor devices according to Embodiments 1 to 4 to the three-phase inverter having the two levels, Embodiments are not limited thereto, but can be applied to the various power conversion devices. Although Embodiment 5 describes the power conversion device having the two levels, the power conversion device may have three or multiple levels. Embodiments of the present invention may be applied to a single-phase inverter when the power is supplied to a single-phase load. Embodiments herein can be also applied to a DC/DC converter or an AC/DC converter when the power is supplied to, for example, a DC load.

The load of the power conversion device is not limited to the electrical motor as described above. The power conversion device can also be used as a power-supply device of, for example, an electrical discharge machine, a laser beam machine, an induction heat cooking device, or a non-contact power feeding system, and can be further used as a power conditioner of, for example, a solar power system or an electricity storage system.

Embodiments can be freely combined, and appropriately modified or omitted within the scope of the invention.

What is claimed is:

1. A method for manufacturing a semiconductor device, the semiconductor device including:
   a semiconductor substrate of a first conductivity type;
   an epitaxial layer of the first conductivity type, the epitaxial layer being formed on a first principal surface of the semiconductor substrate;
   a first semiconductor region of the first conductivity type, the first semiconductor region being formed from an outermost surface to an inner portion of the epitaxial layer;
   a second semiconductor region of a second conductivity type, the second semiconductor region being formed in contact with a side surface of the first semiconductor region;
   a source region and a drain region of the second conductivity type, the source region and the drain region being selectively formed in an upper layer portion of the first semiconductor region;
   a gate electrode formed on the first semiconductor region between the source region and the drain region through a gate insulating film; and
   a third semiconductor region of the second conductivity type, the third semiconductor region being formed from a bottom surface of the first semiconductor region to an inner portion of the semiconductor substrate, the method comprising the steps of:
(a) polishing a second principal surface opposite to the first principal surface of the semiconductor substrate above which at least the source region, the drain region, and the gate electrode are formed to thin the semiconductor substrate; and
(b) ion-implanting impurities of the second conductivity type from the second principal surface of the polished semiconductor substrate to form the third semiconductor region,
wherein step (b) includes (b-1) ion-implanting the impurities of the second conductivity type so that the third semiconductor region is higher in impurity concentration than the second semiconductor region.

2. The method according to claim 1,
wherein the semiconductor device includes a fourth semiconductor region of the second conductivity type, the fourth semiconductor region being formed in contact with a bottom surface of the second semiconductor region and a peripheral portion of the third semiconductor region,
step (b) includes (b-2) forming the third semiconductor region and the fourth semiconductor region, and
step (b-1) includes ion-implanting the impurities of the second conductivity type so that the fourth semiconductor region is higher in impurity concentration than the second semiconductor region.

3. The method according to claim 1,
wherein the semiconductor device further includes a semiconductor layer of the first conductivity type, the semiconductor layer being formed from an outermost surface of the second principal surface to an inner portion of the polished semiconductor substrate, and
the method further comprises (c) ion-implanting impurities of the first conductivity type from the second principal surface of the polished semiconductor substrate to form the semiconductor layer inside the second principal surface, the semiconductor layer being higher in impurity concentration than the polished semiconductor substrate.

4. A method for manufacturing a semiconductor device, the semiconductor device including:
a semiconductor substrate of a first conductivity type;
a first semiconductor region of the first conductivity type, the first semiconductor region being formed from an outermost surface of a first principal surface to an inner portion of the semiconductor substrate;
a second semiconductor region of a second conductivity type, the second semiconductor region being formed in contact with a side surface of the first semiconductor region;
a source region and a drain region of the second conductivity type, the source region and the drain region being selectively formed in an upper layer portion of the first semiconductor region;
a gate electrode formed on the first semiconductor region between the source region and the drain region through a gate insulating film; and
a third semiconductor region of the second conductivity type, the third semiconductor region being formed from a bottom surface of the first semiconductor region to an inner portion of the semiconductor substrate, the method comprising the steps of:
(a) polishing a second principal surface opposite to the first principal surface of the semiconductor substrate on which at least the source region, the drain region, and the gate electrode are formed to thin the semiconductor substrate; and
(b) ion-implanting impurities of the second conductivity type from the second principal surface of the polished semiconductor substrate to form the third semiconductor region,
wherein step (b) includes (b-1) ion-implanting the impurities of the second conductivity type so that the third semiconductor region is higher in impurity concentration than the second semiconductor region.

5. The method according to claim 4,
wherein the semiconductor device includes a fourth semiconductor region of the second conductivity type, the fourth semiconductor region being formed in contact with a bottom surface of the second semiconductor region and a peripheral portion of the third semiconductor region,
step (b) includes (b-2) forming the third semiconductor region and the fourth semiconductor region, and
step (b-1) includes ion-implanting the impurities of the second conductivity type so that the fourth semiconductor region is higher in impurity concentration than the second semiconductor region.

6. The method according to claim 4,
wherein the semiconductor device further includes a semiconductor layer of the first conductivity type, the semiconductor layer being formed from an outermost surface of the second principal surface to an inner portion of the polished semiconductor substrate, and
the method further comprises (c) ion-implanting impurities of the first conductivity type from the second principal surface of the polished semiconductor substrate to form the semiconductor layer inside the second principal surface, the semiconductor layer being higher in impurity concentration than the polished semiconductor substrate.

7. A power conversion device, comprising:
a main conversion circuit including the semiconductor device manufactured according to the method according to claim 1, the main conversion circuit converting an input power;
a drive circuit outputting, to the semiconductor device, a driving signal for driving the semiconductor device; and
a control circuit outputting, to the drive circuit, a control signal for controlling the drive circuit.

8. A power conversion device, comprising:
a main conversion circuit including the semiconductor device manufactured according to the method according to claim 4, the main conversion circuit converting an input power;
a drive circuit outputting, to the semiconductor device, a driving signal for driving the semiconductor device; and
a control circuit outputting, to the drive circuit, a control signal for controlling the drive circuit.

* * * * *